United States Patent [19]
Kahng et al.

[11] Patent Number: 5,107,314
[45] Date of Patent: Apr. 21, 1992

[54] GALLIUM ANTIMONIDE FIELD-EFFECT TRANSISTOR

[75] Inventors: Dawon Kahng; James D. Chadi, both of Princeton, N.J.

[73] Assignee: NEC Research Institute, Princeton, N.J.

[21] Appl. No.: 670,057

[22] Filed: Mar. 15, 1991

[51] Int. Cl.[5] .............................................. H01L 29/78
[52] U.S. Cl. .................................... 357/23.15; 357/4; 357/16; 357/42
[58] Field of Search ...................... 357/23.15, 4, 16, 42

[56] References Cited

U.S. PATENT DOCUMENTS 4,866,491   9/1989   Solomon et al. ................. 357/23.15

OTHER PUBLICATIONS

Capasso et al.—Appl. Phys. Lett.—vol. 51, No. 7, Aug. 17, 1987, pp. 526–527.
Longenbach et al.—IEEE Trans. on Electron Devices—vol. 37, No. 10, Oct. 1990.
"A Complementary Heterostructure Field Effect Transistor Technology Based on InAs/AlSb/GaSb/"—by K. F. Longenbach et al.—IEEE Transactions on Electron Devices, vol. 37, No. 10, Oct. 1990 0018-9383/90/1000-226501.00 1990 IEEE.
"p-Channel Modulation-Doped Field-Effect Transistors Based on AlSb0.9As0.1/GaSb"—by L. F. Luo et al.—IEEE Electron Device Letters, vol. 11, No. 12, Dec. 1990—0741-3106/90/1200-0567m, 1990 IEEE.

Primary Examiner—Edward J. Wojciechowicz
Attorney, Agent, or Firm—A. J. Torsiglieri

[57] ABSTRACT

A complementary MISFET uses gallium antimonide as the active material to utilize the high mobilities of both holes and electrons in such material. To avoid interfacial states at the gate interface, the gate insulator is an epitaxial composite layer formed by an appropriate superlattice of which the portion adjacent the channel region is free of intentional doping. The superlattice may comprise, for example, alternating layers of aluminum antimonide and aluminum arsenide or of aluminum antimonide and gallium arsenide.

10 Claims, 1 Drawing Sheet

GALLIUM ANTIMONIDE FIELD-EFFECT TRANSISTOR

FIELD OF INVENTION

This invention relates to integrated circuits using metal-insulator semi-conductor field-effect transistors (MISFETS) and more particularly to integrated circuit chips that include a large number of MISFET circuit elements.

BACKGROUND OF THE INVENTION

As is known, the quest in the semiconductor industry is for integrated circuit chips of ever larger throughput. One factor that can limit this throughput is overheating from the heat dissipated in the circuit. Overheating can destroy the relatively fragile tiny semiconductive circuit elements. To limit such heat dissipation, it has become common practice to employ complementary MISFETS circuitry whereby the quiescent current can be kept low, as is desirable to keep heat dissipation low. Such complementary circuits include both P-type and N-type MISFETS and for an integrated circuit it is necessary to have both types on the same chip. Moreover, it is also known to be preferable to have available field-effect transistors of the enhancement-mode type as compared to depletion-mode type since it is usually advantageous that the transistors be essentially off when in their quiescent state to reduce the amount of current dissipated by the integrated circuit.

Another expedient to avoid overheating is to refrigerate the integrated circuit. Operation at a low temperature has the added advantage of reducing the thermal generation of charge carriers, holes and electrons, making the semiconductor circuit element less noisy and thereby permitting operation with lower current levels, which results in lower power dissipation.

Another factor that is important to high throughput for an integrated circuit is keeping short the delay introduced by the time it takes a transistor to switch between conducting and non-conducting states. Generally this time is determined by how long it takes the active charge carriers, electrons in N-type MISFETS and holes in P-type MISFETS, to transverse the channel region of the transistor. This time is dependent not only on the length of the channel but also on the mobility of the active charge carrier. Accordingly, in complementary circuits, the mobilities of both the holes and electrons are important to achieve short delays and so high speed.

A shortcoming of gallium arsenide, the most popular component semiconductor, for use in high throughput complementary circuitry is the low mobility of its holes since this limits the speed with which the P-type MISFETS can be switched between states. This in turn limits the speed that can be achieved in a complementary circuit using gallium arsenide circuit elements.

It is known that this shortcoming is essentially absent in gallium antimonide in which both holes and electrons have relatively high mobilities, especially when the gallium antimonide is operated below room temperature, for example, at about liquid nitrogen temperature (77K). As mentioned above, operation below room temperature is desirable also to reduce thermal noise and thereby desirably to permit operation with lower levels for the signals.

However, a problem hitherto with the use of gallium antimonide as the active semiconductor in a MISFET has been the difficulty of establishing a good insulated layer for the gate connection to its channel region. As is well known, in an MISFET, it is important to establish an insulated layer for the gate connection to its channel region that is relatively free of interfacial states, since these states undesirably act to shield the channel against penetration of the electric field being supplied for control by the gate voltage during operation. A critical factor in the success of the silicon MISFET particularly that of the enhancement mode type, is the ability of its thermally-grown native, or genetic, oxide to provide an insulating layer for the gate connection that is relatively free of interfacial states. For operation with low threshold levels which is necessary to support low signal levels, for example, no more than a few hundredth of a volt, as is desirable is high density integrated circuits, the concentration of interfacial states should be less than $10^{11}$ per cubic centimeter, and preferably less than $10^{10}$ per cubic centimeter. However, with gallium antimonide, a native oxide layer does not possess similar properties and thus cannot be used as an insulating layer, so that an alternative approach is needed.

It is known that the intrinsic resistivity of a semiconductive material is related to its band gap, the minimum energy separation between its highest occupied state and its lowest empty state in its energy diagram. Accordingly, a semiconductor with a relatively wide band gap can act essentially as an insulator with respect to a semiconductor with a relatively narrow band gap.

Accordingly, there previously have been proposals, for use in a MISFET as the gate insulating layer, a layer of semiconductor of a wider band gap than that of the semiconductor forming the channel. In practice, this proved to be difficult in the case of a gallium antimonide channel without increasing significantly the interfacial states since the layer of semiconductor typically had to include foreign atoms to facilitate lattice matching and to function effectively in its intended role, and such doping added interfacial states.

BRIEF SUMMARY OF THE INVENTION

The present invention is a high speed MISFET in which gallium antimonide is the active channel material. A feature of the invention is the use in such a MISFET of an appropriate superlattice of alternating layers, for example, of aluminum antimonide and aluminum arsenide, or of aluminum antimonide and gallium arsenide, to form a composite gate insulating layer relatively free of interfacial states, that can be used with a suitable gate electrode to serve as the control. The ratio of the thicknesses of the two layers is important for lattice matching to the gallium antimonide to keep interfacial states low and the optimal ratio is found by a minimization of elastic strain energies. The use of a two-component composite layer also helps to inhibit chemical disorder at the interface.

Advantageously, the superlattice composite layer is formed by molecular beam expitaxy on a gallium antimonide substrate and, at least the portion proximate the substrate, is grown essentially free of intentional doping whereby such portion can be relatively free of interfacial states. The MISFET advantageously is of the enhancement-mode form and utilizes a channel layer, preferably free of intentional doping. Such a layer can be of high mobility and also of sufficiently high resistivity that it can be used either for N-Type or P-type operation by appropriate choice of the source, gate and drain materials.

Generally to permit operation with low level signals, as is desirable in high density integrated circuits, it is desirable that the MISFETs have low threshold voltages, for example, no more than several hundreth of a volt. To this end, it is important that in the quiescent state the offset voltage between the channel and the gate electrode be appropriately low and of the proper polarity dependent on the type of operation intended.

In a preferred embodiment, the desired offset voltage is achieved by doping the portion of the composite gate insulating layer that is proximate the gate electrode and distant from the channel. Such limited doping should add few interfacial states.

Alternatively, the desired offset voltage may be achieved by appropriately doping the channel region but this doping will tend to reduce the mobility of change carriers therein, although if the doping is light enough, this may be tolerable.

Finally, to a lesser extent, the offset voltage can be affected by the choice of material for the gate electrode.

In any case, conditions should be such that in the absence of an applied voltage to the gate electrode there results a voltage condition between the channel and the gate that is offset slightly from zero, the offset being such that the channel with respect to the gate is slightly negative for a P-type MISFET and slightly positive for an N-type MISFET to achieve the desired enhancement mode operation for the MISFET.

Additionally, in the usual fashion, on opposite sides of the gate channel there are provided the source and drain regions. In the P-type MISFET these regions are sufficiently heavily doped P-type to introduce holes from the source for travel to the drain and in the N-type MISFET are sufficiently heavily doped N-type to introduce enough electrons. Advantageously ion implantation is used to dope appropriately the source and drain regions of the gallium antimonide layer.

The invention will be more fully described in connection with the accompanying drawing in which the single FIGURE shows in cross section a complementary pair of enhancement-mode MISFET's, each of which includes a channel of gallium antimonide and a composite super-lattice layer that serves as its gate insulator in accordance with the invention, and source. drain and gate electrodes.

DETAILED DESCRIPTION

Figure 1:
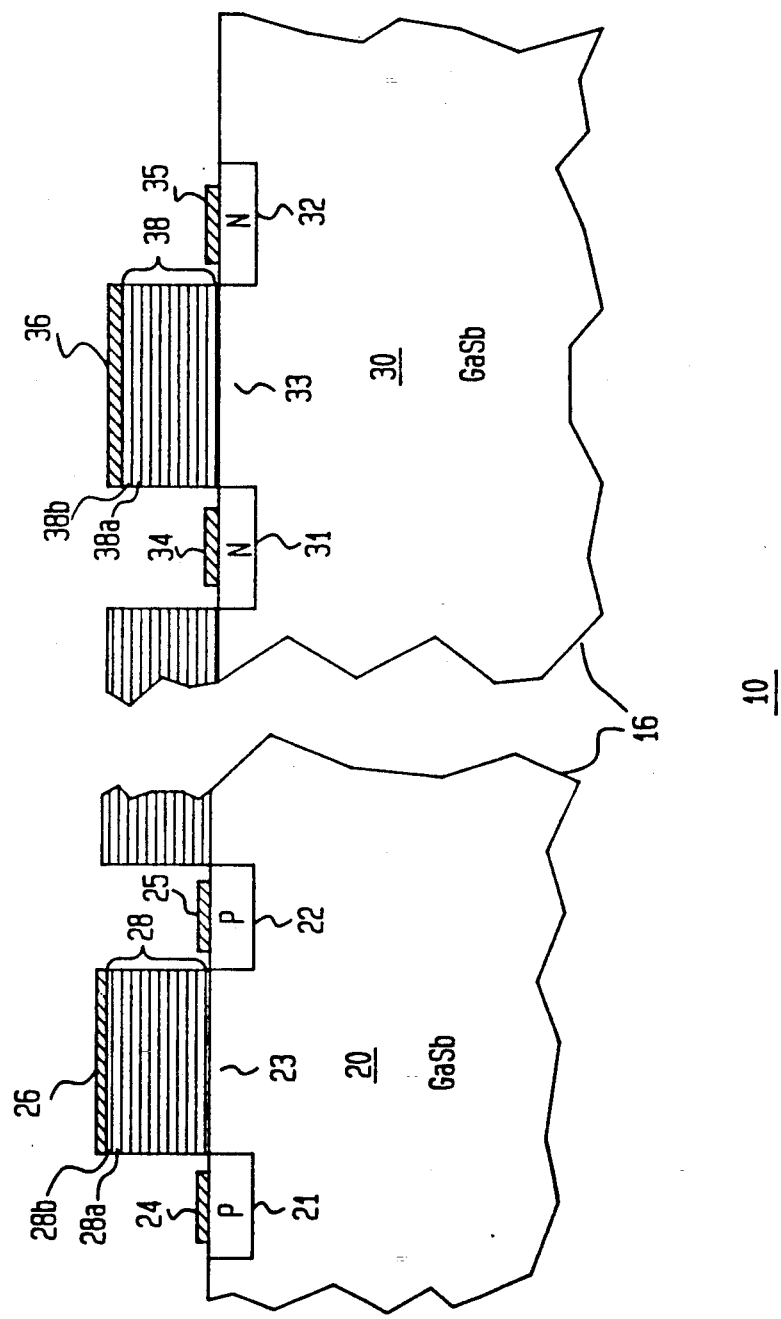

With reference now to the drawing, the figure shows in cross section a fragment of a semiconductive chip 10 that includes both a P-type enhancement mode MISFET 20 and an N-type enhancement mode MISFET 30. It should be appreciated that the drawing is not to scale and that the chip would normally incorporate many such transistors of each type.

The chip 10 comprises the gallium antimonide monocrystalline layer 16 which includes the main signal current conduction paths of the separate MISFETs 20 and 30.

The P-type MISFET 20 comprises P-type source and drain regions 21 and 22, respectively, between which extends the channel region 23 of semi-insulating gallium antimonide that preferably has not been intentionally doped.

Additionally, electrodes 24 and 25 make low resistance contacts to source and drain regions 21, 22, respectively. Gate electrode 26 makes a capacitive connection to the channel 23 by way of the composite gate insulation layer 28 which is a superlattice, preferably alternately of layers 28A of aluminum antimonide and layers 28B of gallium arsenide.

The N-Type MISFET 30 includes N-type source and drain regions 31, 32, respectively, between which extends channel region 33 of semi-insulating gallium antimonide that preferably has not been intentionally doped. Electrodes 34 and 35 make low resistance contacts to source and drain regions 31, 32 respectively. Gate electrode 36 makes a capacitive connection to the channel 34 by way of the composite gate insulation layer 38 which is a superlattice similarly preferably alternately of layers 38A of aluminum antimonide and 38B of gallium arsenide. Advantageously for ease of manufacture, the layers 28 and 38 preferably are separate portions of what was initially formed as a continuous layer.

Typically, the chip 10 is formed by growing a layer of gallium antimonide by molecular beam epitaxy technology known in the art on a suitable substrate, typically a (001) crystal of high purity gallium arsenide (not shown). To improve the quality of the grown layer, it may be advantageous usually first to grow a buffer layer, for example, a layer of a gallium arsenide-antimonide ternary compound in which the percentage of arsenide is gradually decreased, to provide lattice matching between the gallium antimonide grown layer and the original gallium arsenide substrate. Since the initially grown portion of the gallium antimonide layer is relatively inactive in the operation of the MISFETs, there needs to be little concern about defects localized is such region so long as they do not propagate to the later-grown active portion of the gallium antimonide layer. Advantageously, the gallium antimonide layer is grown undoped and, typically, it is about several hundreds Angstroms thick, although thinner or thicker layers should be feasible.

Then there is grown epitaxially the composite superlattice layer that is to provide the gate insulation regions 28 and 38. As known in the art, the relative thickness of the alternating layers must be appropriate if good lattice matching is to be achieved. In our typical embodiment, there is first grown a layer of aluminum antimonide which is an integral multiple of thirty one atomic planes thick along the (001) axis, and this is followed by the growth of a layer of aluminium arsenide which is the same integral multiple of two atomic planes thick along the same axis, where the integral multiple can at least be as high as ten. A multiple of one would be feasible if control were tight enough to achieve two atomic layer thicknesses reliably. Generally there should be several layers of each, and a total thickness of several hundred Angstroms typically should be realized for layers 28, 38. The total thickness should be enough to minimize tunnelling from the gate electrode to the gallium antimonide and thin enough to permit adequately low threshold voltages.

The choice of materials and the relative thicknesses of the alternating layers are chosen both to provide an interface between the gallium antimonide substrate layer 16 and the superlattice layer 28, 38 that has very little lattice mismatch and exhibits little chemical-disorder induced scattering and also to provide a superlattice with a significantly wider effective band gap than that of the gallium-antimonide.

The band gap of aluminum antimonide is between 1.6 and 1.7 electron volts and that of the aluminum arsenide is between 2.2 and 2.3 electron volts, both of which are substantially higher than 0.7–0.8 electron volts of the gallium antimonide. Moreover, because aluminum antimonide and aluminum arsenide have a common cation, aluminum, and aluminum antimonide and gallium antimonide have a common anion, antimony, the combination that has been chosen is advantageous from a chemical aspect.

Alternatively, one might use a combination of a first layer of aluminum antimonide an integral multiple of 15 atomic layers thick that alternates with a second layer of gallium arsenide the same integral multiple of one atomic layer thick. Presumably other combinations can be found.

After the composite gate insulation layer has been deposited uniformly over the gallium antimonide, the processing can proceed in fairly conventional fashion. As is known to workers in the art, a detailed process specification is apt to involve many tens of steps including a number of photolithographic steps, cleaning and etching steps, heating steps, ion implantation steps, masking steps, etc. In the interest of expediency, only the basic steps will be described herein.

Generally, when both P-type and N-Type MISFETS are to be provided on the same chip, as is desired for complementary integrated circuits, it is advantageous to process separately the two types during the intermediate stages of the processing. This usually is done by masking those regions where P-type devices are to be formed while forming the N-type devices, and vice versa. For purposes of exposition it will be assumed that the P-type devices are to be formed first and that the regions where the N-type devices are to be formed are then covered with an impervious mask so that these regions are little affected during the processing of the P-type devices.

The processing of the separate types can proceed in the usual manner. In those instances where the type of MISFET obtained is to be controlled at least partially by doping of the composite layer, the doping typically would be introduced at this stage, although the doping could have been introduced earlier during the molecular beam growth of the composite layer. Such later doping typically would be done by ion implantation, care being taken to control such implantation so as to avoid creating undesirable interfacial states by introducing ions in the composite layer too close to the interface of the composite layer with the gallium antimonide channel region. After such doping, one can proceed in any suitable manner.

It is usually advantageous to use with appropriate modification the self-aligned gate process familiar for the manufacture of complementary silicon MOSFET-circuits.

Basically this involves depositing over the composite layer in the regions of interest, a layer of a material useful as the gate electrode, such as tungsten. This gate electrode layer is then patterned in conventional fashion using photolithographic techniques to define the gate electrode 26. This gate electrode 26 is then used as a mask to etch away the portions of the composite layer where the source and drain regions 21,22 are to be formed.

Next the P-type source and drain regions 21 and 22 are formed in the gallium antimonide where the composite layer has been removed. Advantageously, these regions are formed by ion implantations of a suitable ion, such as beryllium, carbon or zinc, that will serve in time as an acceptor where introduced, thereby effectively converting such implanted regions to P-type, typically after annealing moves the implanted ions out of interstices into appropriate crystal sites. In some instances, it may be desirable first to form a protective cap over the surfaces to be ion implanted to minimize surface damage by the ion implantation. The dosage and accelerating voltage for the implantation should be chosen to achieve a desired concentration of acceptor doping, typically of the order of 1018 cm−3, and desired depth, typically at least 200 angstroms. Next there are formed the source and drain ohmic contacts 24,25 localized over the P-type regions 21,22. Typically these may be formed by evaporating a layer of a suitable metal, such as a zinc gold alloy, over the surface and then suitably patterning the evaporated layer to leave the desired source and drain contacts 24, 25. In some instances, the source and drain contacts are formed later in the processing so that the source and drain contacts of both N-type and P-type MISFETs are formed in common processing steps.

After the P-type MISFETS have been formed, the regions corresponding to such devices would be covered with a suitable mask, the regions where the N-type MISFETS are to be formed would be unmasked, and the desired N-type MISFETS then formed there in an analogous fashion, with appropriate changes in the choice of materials used in light of the need now to form N-type MISFETS. In this case, selenium or sulphur are typical suitable donors for doping the source and drain.

In the case of the N-type MISFETS in which the gate control is to be achieved by doping by implantation of suitable ions into the composite gate insulator layer, as previously discussed, acceptor type ions would be suitable.

In either the P-type or N-type device, when the offset voltage is to be affected by the material used for the gate electrode, the choice of the material is best made empirically since it will depend on the properties realized for the composite layer and the channel region. An appropriately doped layer of aluminum antimode, aluminum arsenide, or gallium arsenide or, some alloy thereof should provide suitable. Alternatively a zinc-gold alloy can be used with little effect.

Alternatively as mentioned above, in some instances one might prefer to control the offset voltage by appropriate doping of the gallium antimonide channel rather than leave it undoped. In this case, the doping of the separate regions is best done before the growth of the composite gate insulator layer. It can be appreciated that various other processes can be devised for making embodiments of the invention.

In addition, it should be evident that the technique of using a superlattice to provide a lattice matched composite layer that is useful as the insulating layer for the gate connection to a MISFET should be broadly applicable to MISFETS using other species of semiconductive materials for the channel whenever it is otherwise difficult to provide such an insulating layer with few interfacial states or other defects conveniently.

What is claimed is:

1. A gallium antimonide metal insulated gate field effect transistor comprising,
a gallium antimonide monocrystalline element having along one surface, source and drain zones of relatively low resistivity material of one conductivity type spaced apart by a channel region of relatively high resistivity material, an epitaxial composite layer for serving as an insulating layer comprising a superlattice of alternating layers of first and second semiconductors each different from gallium antimonide coextensive with said channel region, the portion of said composite layer contiguous to the channel region being free of intentional doping to avoid the introduction of undesirable interfacial states, the thickness of the superlattice being adequate to minimize tunneling therethrough during normal operation, and source, drain and gate electrodes associated with said source and drain zones and the composite layer, respectively.

2. A transistor in accordance with claim 1 further characterized in that the composite layer consists of alternating layers of aluminum antimonide and aluminum arsenide.

3. A transistor in accordance with claim 1 further characterized in that the composite layer consists of alternating layers of aluminum antimonide and gallium arsenide.

4. A transistor in accordance with claim 1 further characterized in that the threshold voltage of the transistor is set by a concentration of dopants in the composite layer in regions thereof remote from its interface with the gallium antimonide layer.

5. A transistor in accordance with claim 1 in which the source and drain zones are P-type.

6. A transistor in accordance with claim 1 in which the source and drain zones are N-type.

7. A transistor in accordance with claim 1 in which the channel region is free of intentional doping and of resistivity sufficiently high that it can serve as the channel region of either a P-type or N-type enhancement mode transistor.

8. A complementary MISFET including separate N-type and P-type enhancement mode transistors of which each transistor includes a source region and a drain region separated by a channel of a first semiconductor, a gate connection to said channel, and a composite layer between the gate connection and the channel characterized in that the composite layer comprises a plurality of alternating layers of second and third different semiconductors, forming with the channel an epitaxial superlattice essentially free of interfacial states and having an effective band gap width larger than that of the channel, whereby the composite layer serves as an insulating layer and there results between the channel and the gate connection a small offset voltage, the thickness of the composite layer being adequate to minimize tunneling between the channel and gate connection during normal operation.

9. A complementary MISFET according to claim 8 in which the plurality of alternating layers includes several layers each of the second and third different semiconductor materials and the thickness of the composite layer is several hundred Angstroms.

10. A gallium antimonide metal insulated gate field effect transistor according to claim 1 in which the superlattice includes several layers each of the first and second semiconductors and its thickness is several hundred Angstroms.

* * * * *